(12) United States Patent
Glick et al.

(10) Patent No.: US 6,217,341 B1
(45) Date of Patent: Apr. 17, 2001

(54) INTEGRATED CIRCUIT TEST SOCKET HAVING TORSION WIRE CONTACTS

(75) Inventors: Michael Glick, South Bend, IN (US); Valts Treibergs, White Bear Township, MN (US)

(73) Assignee: Wells-CTI, Inc., South Bend, IN (US)

( * ) Notice: Subject to any disclaimer, the term of this patent is extended or adjusted under 35 U.S.C. 154(b) by 0 days.

(21) Appl. No.: 09/285,233

(22) Filed: Apr. 1, 1999

(51) Int. Cl.[7] .................................................. H01R 12/00
(52) U.S. Cl. ................................................ 439/66; 439/72
(58) Field of Search ................................. 439/70–72, 66, 439/73

(56) References Cited

U.S. PATENT DOCUMENTS

| | | | |
|---|---|---|---|
| Re. 34,084 | * 9/1992 | Noschese | 439/66 |
| Re. 35,693 | 12/1997 | Kerul et al. | |
| 4,334,727 | * 6/1982 | Scheingold et al. | 439/71 |
| 4,620,761 | * 11/1986 | Smith et al. | 439/372 |
| 4,678,255 | 7/1987 | Carter | |
| 4,786,256 | * 11/1988 | Angeleri et al. | 439/72 |
| 4,906,194 | * 3/1990 | Grabbe | 439/71 |
| 4,940,432 | * 7/1990 | Consoli et al. | 439/862 |
| 5,049,813 | * 9/1991 | Van Loan et al. | 324/754 |
| 5,167,512 | * 12/1992 | Walkup | 439/66 |
| 5,205,756 | 4/1993 | Myers | |
| 5,230,632 | * 7/1993 | Baumberger et al. | 439/66 |
| 5,395,252 | * 3/1995 | White | 439/66 |
| 5,409,392 | 4/1995 | Marks et al. | |
| 5,427,535 | * 6/1995 | Sinclair | 439/66 |
| 5,493,237 | * 2/1996 | Volz et al. | 324/754 |
| 5,628,635 | * 5/1997 | Ikeya | 439/70 |
| 5,633,490 | * 5/1997 | Vandenengel | 235/492 |
| 5,813,869 | * 9/1998 | Matsumura | 439/72 |
| 6,019,612 | * 2/2000 | Hasegawa et al. | 439/73 |

* cited by examiner

Primary Examiner—Brian Sircus
(74) Attorney, Agent, or Firm—Baker & Daniels

(57) ABSTRACT

An integrated circuit test socket is provided with contact holders which support torsion spring contacts in the socket. Each contact includes a length of wire which includes a wound portion with a pair of arms extending from opposite ends of the wound portion. One of the arms terminates in a portion engaging a corresponding terminal on an integrated circuit undergoing test, and the other arm includes a portion extending through a corresponding aperture in the socket to make electrical contact with a conductor of a circuit board.

28 Claims, 8 Drawing Sheets

INTEGRATED CIRCUIT TEST SOCKET HAVING TORSION WIRE CONTACTS

This invention relates to a test socket for installing integrated circuits on a printed circuit board.

After manufacture, integrated circuits must be tested, often at elevated temperatures. The integrated circuits are temporarily installed on a circuit board, tested, and then removed from the circuit board and shipped. Accordingly, sockets are necessary to install the integrated circuits on the printed circuit board for testing. These sockets must include multiple contacts to connect each of the terminals of the integrated circuit chip to corresponding conductors in the circuit board. Since the sockets are used repeatedly in high volume integrated circuit chip manufacture, it is desirable that the sockets be durable and capable of reliable, repeated operation. Prior art test sockets use stamped contacts, which are difficult to accurately install in the socket, and are incapable of accommodating large deflections which sometimes occur when the integrated circuit chip is installed in the socket. Once stamped contacts have been over-deflected, the contacts no longer perform properly and the socket must be discarded. Since multiple chips are commonly tested on a single circuit board, it is also desirable that the sockets be designed to maximize the number of sockets which may be mounted in a given area. Furthermore, manufacture of stamped contacts requires expensive dies and other special equipment.

According to the present invention, the contacts used in a test socket are torsion wire contacts manufactured by winding a wire segment into a wound portion with a pair of deflectable arms extending from the wound portion. The wound portion is installed in a slot in a contact holder, which carries multiple torsion wire contacts. The arms of the torsion wire contact extend from the contact holder in opposite direction through apertures in the socket base which holds the contact holders. One of the arms engages the printed circuit board, and the other arm is engaged by a corresponding terminal of an integrated circuit when the integrated circuit is installed in the socket.

Accordingly, the torsion wire contacts can accommodate much greater deflections without damaging the contacts as compared to the prior art stamped contacts. Further, the torsion wire contacts of the present invention may be manufactured without using special dies or other expensive equipment. Furthermore, the contacts of the present invention utilize space such that the contacts may be packed very closely together, thereby accommodating the closely packed terminals on newer integrated circuits. The torsion wire contacts of the present invention are more forgiving in any actuation direction than the prior art stamped contacts.

These and other advantages of the present invention will become apparent from the following description, with reference to the accompanying drawings, in which.

Figure 1:
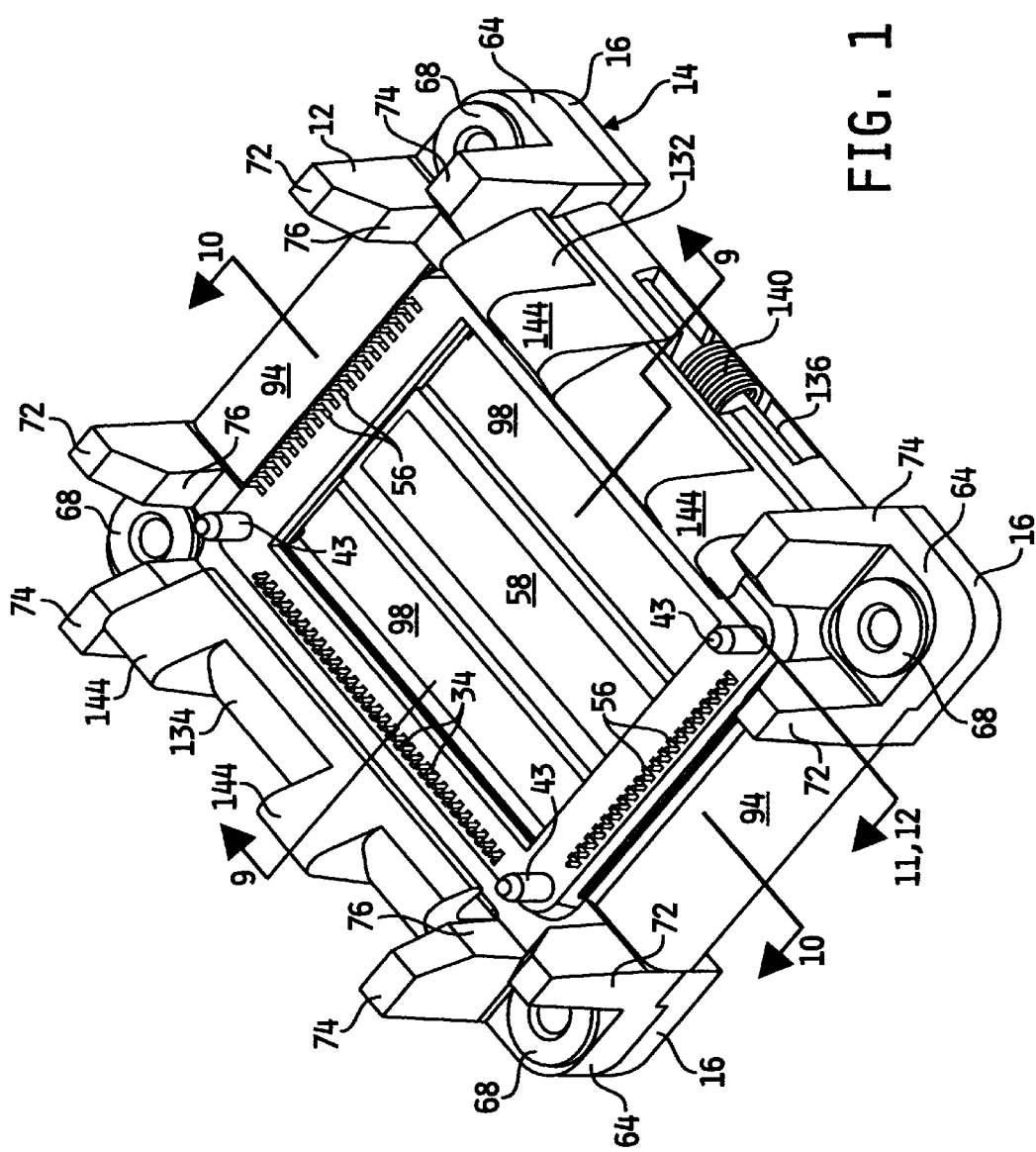
FIG. 1 is a view in perspective, taken from above, of a socket made pursuant to the teachings of the present invention.
Figure 2:
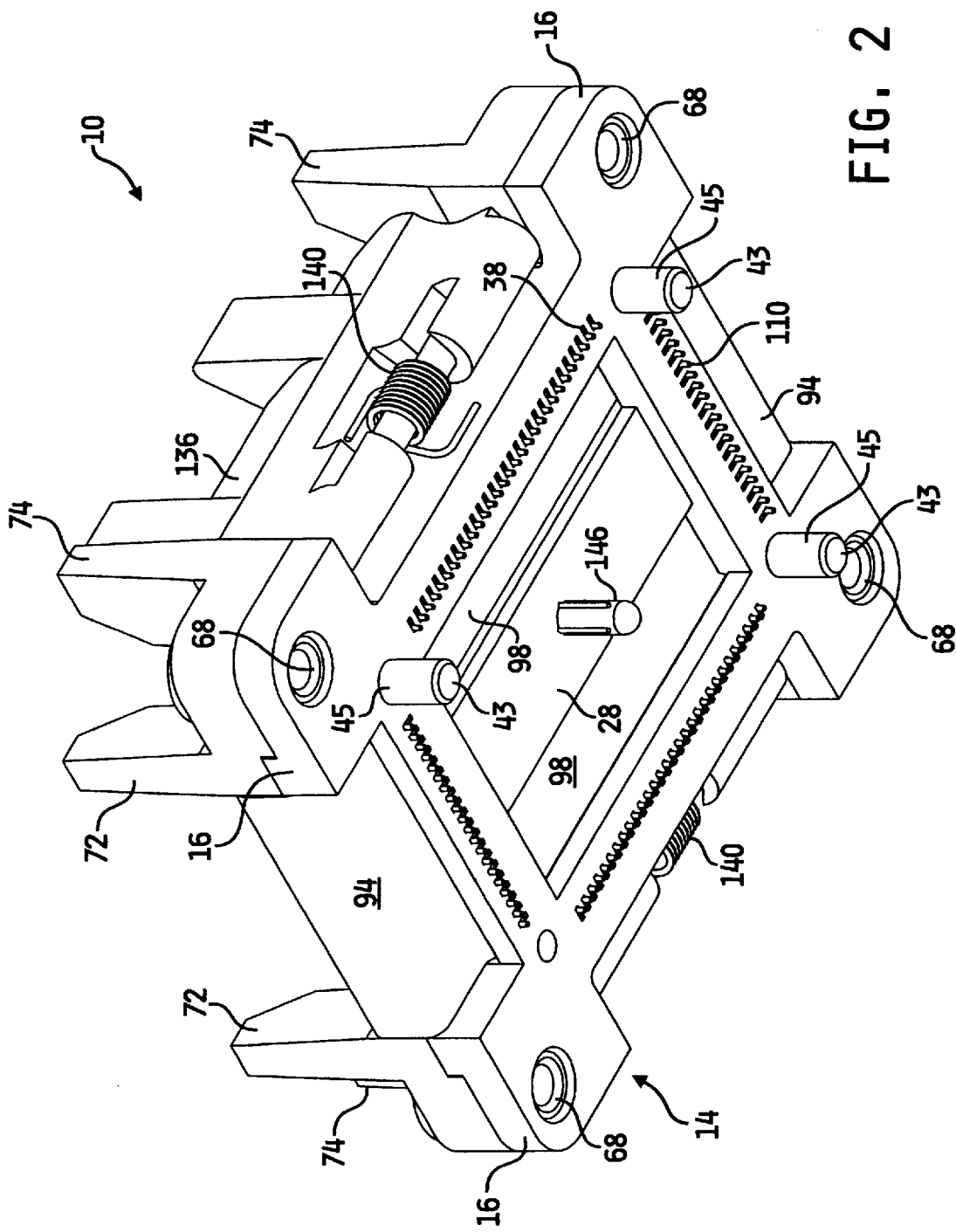
FIG. 2 is a view in perspective of the socket illustrated in FIG. 1, but taken from below.
Figure 3:
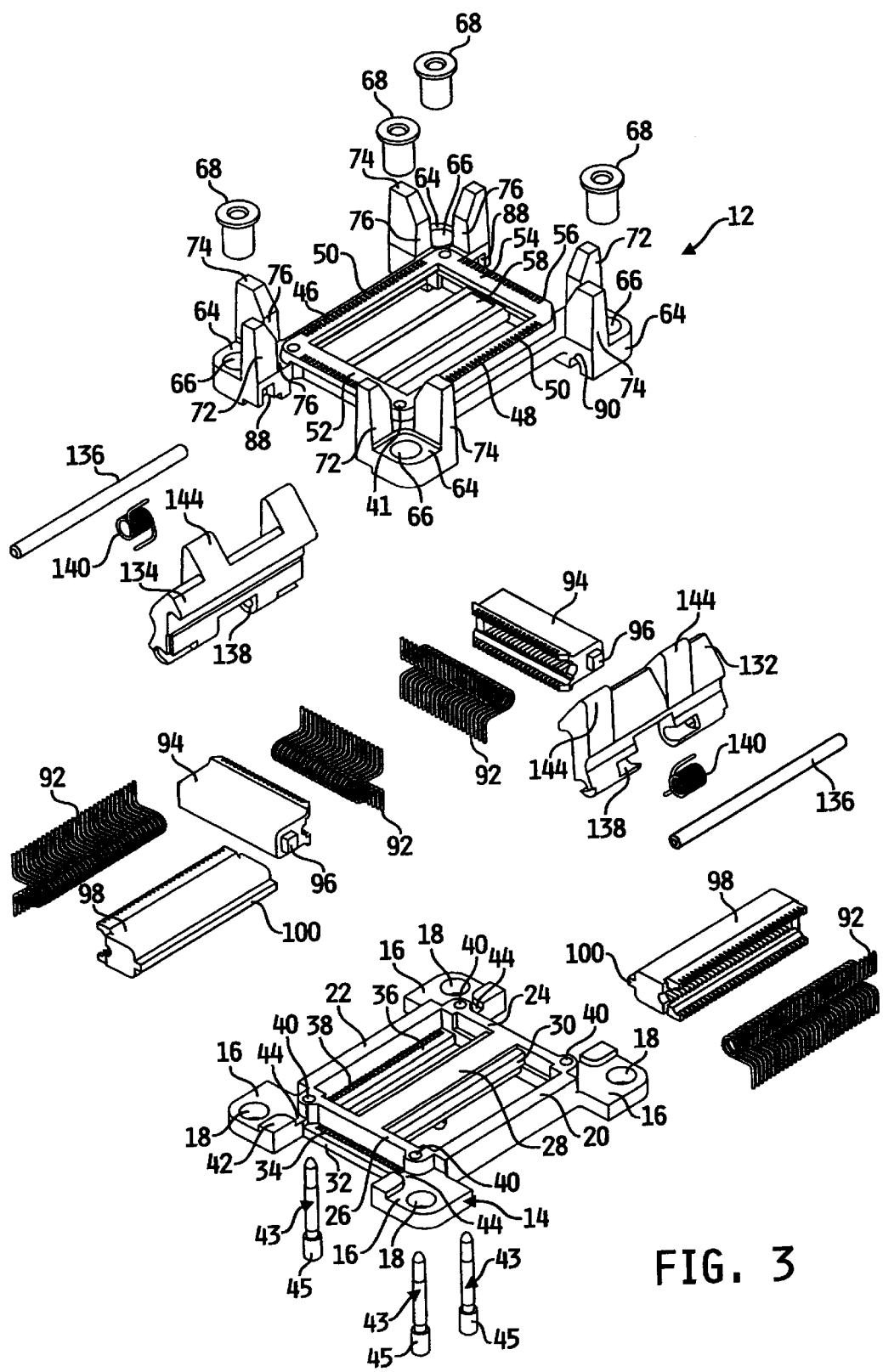
FIG. 3 is an exploded view in perspective of the socket illustrated in FIGS. 1 and 2.
Figure 6:
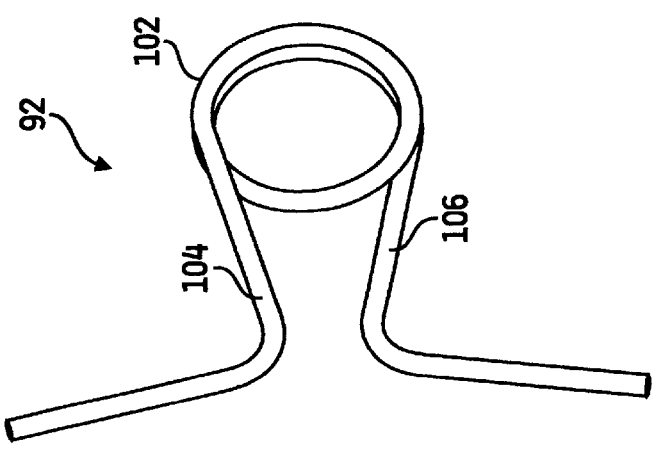
Figure 5:
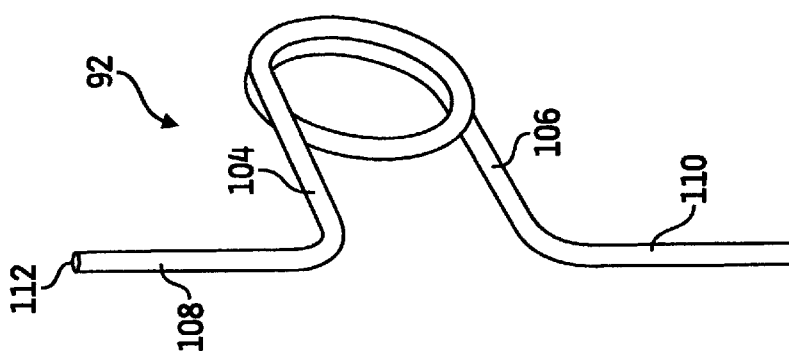
Figure 4:
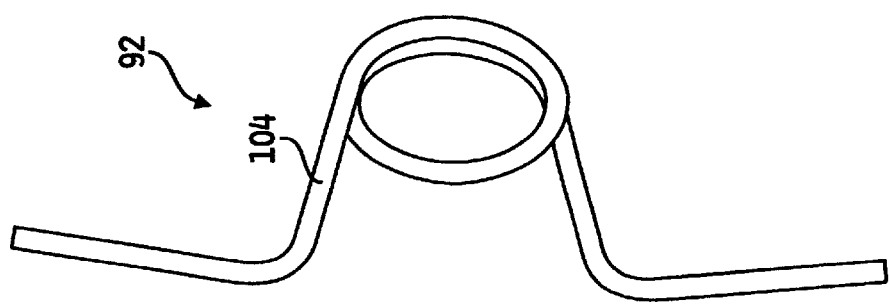
Figure 7:
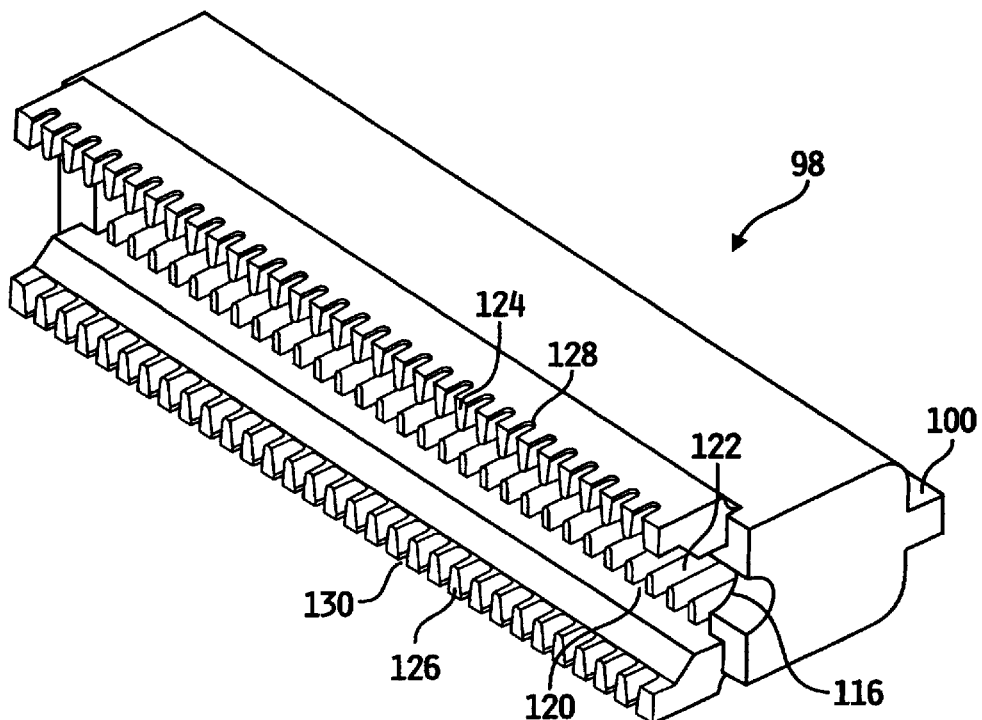
Figure 8:
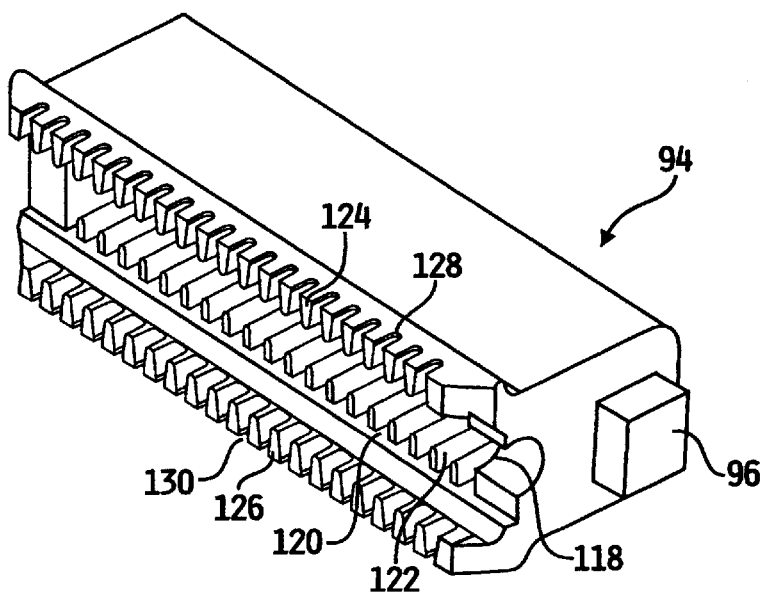
Figure 9:
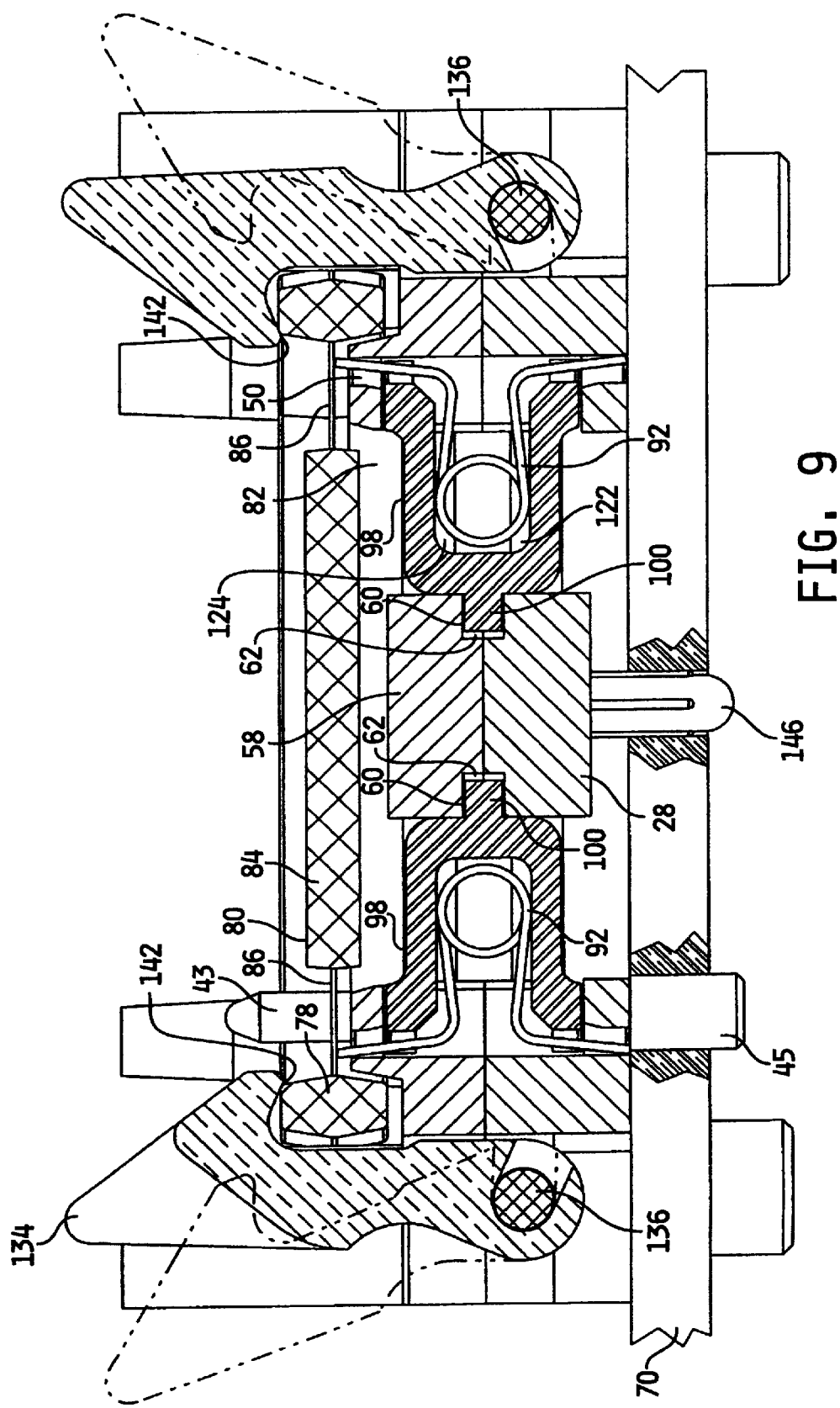
Figure 10:
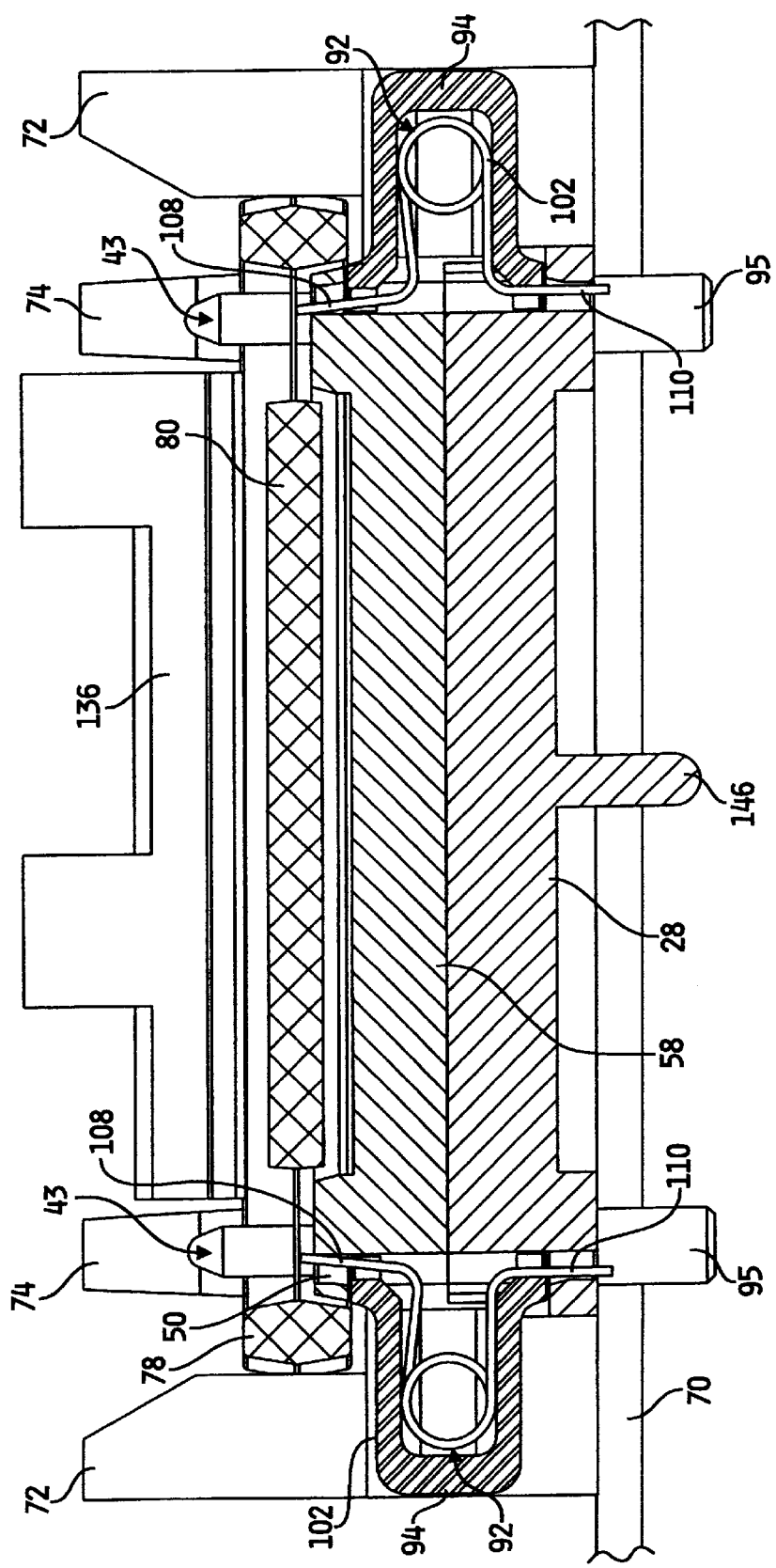
Figure 11:
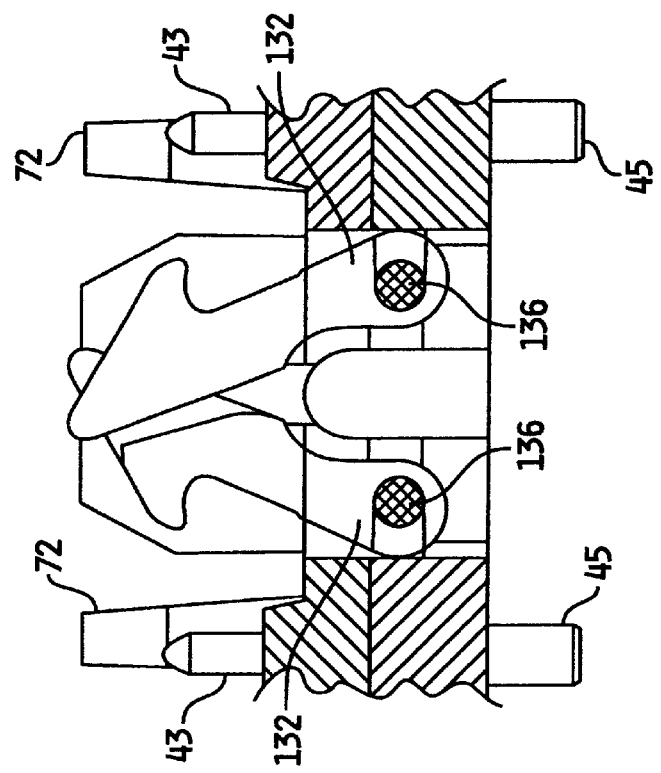
Figure 12:
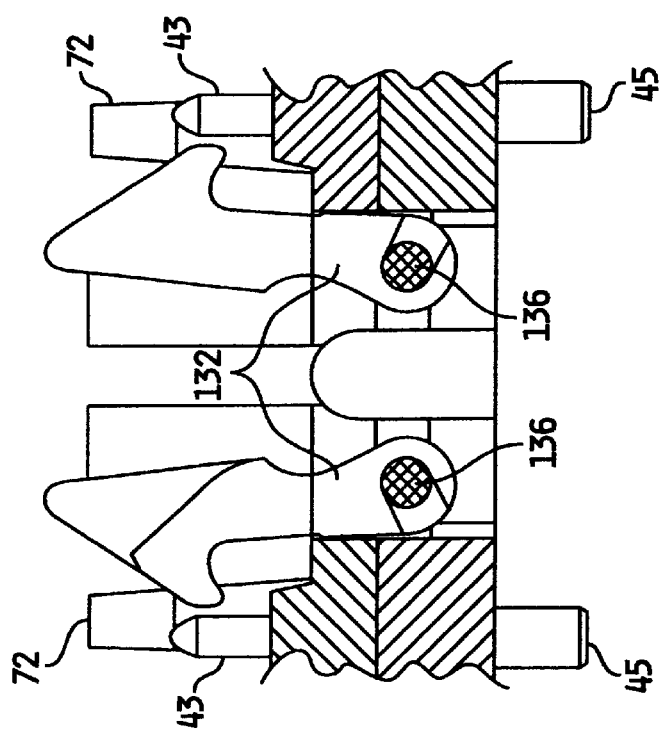

FIG 4, FIG. 5, and FIG. 6 are views in perspective of the torsion spring contacts used in the sockets illustrated in FIGS. 1–3;

FIGS. 7 and 8 are views in perspective of the contact holders which are a component of the socket illustrated in FIGS. 1–3;

FIG. 9 is a cross-sectional view taken substantially along lines 9—9 of FIG. 1, but illustrating the socket with an integrated circuit chip installed therein;

FIG. 10 is cross-sectional view taken substantially along lines 10—10 of FIG. 1, but illustrating an integrated circuit chip installed within the socket; and FIGS. 11 and 12 are fragmentary views of adjacent sockets illustrating the manner in which the latching levers are designed to permit a maximum concentration of sockets on a circuit board.

Referring now to the drawings, a test socket generally indicated by the numeral 10 includes an upper base housing 12 and a lower base housing 14. The lower housing 14 includes outwardly projecting ears 16 at the corners thereof which define apertures 18. Lower housing 14 further includes raised side edges 20, 22 and end edges 24, 26, with a connecting portion 28 extending therebetween. Connecting portion 28 is provided with recesses 30 on opposite upper corners thereof. A projecting portion 32 projects outwardly from each of the end edges 24, 26 and are provided with spaced apertures 34. Projecting portions 36 project inwardly toward the connecting portion 28 from each of the side edges 20, 22 and are provided with spaced apertures 38. Each of the ears 16 are further provided with a upwardly projecting pad 42, which cooperates with the edges 24, 26 to define a notch 44 therebetween.

The corners between the edges 22, 26 are provided with apertures 40 which receive locator pins 43, as will hereinafter be described. It is noted that only three locator pins are provided, which are received in three of the four apertures 40. Three of the apertures 40 register with corresponding apertures 41 in upper base housing 12. The locator pins 43 are driven into the apertures 40, 41 and each of the pins 43 includes a projecting portion 45. When the socket is installed on a circuit board, the pins 43 are received within corresponding apertures on the circuit board to assure proper positioning of the socket on the circuit board.

The upper base housing 12 is provided with side edges 46, 48 which are provided with multiple apertures 50. Side edges 46, 48 are interconnected by end edges 52, 54, which are similarly provided with spaced apertures 56. Cross member 58 interconnects the end edges 52, 54, and extends over the connecting portion 28 of lower housing 14 when the upper housing 12 is installed on the lower housing 14, as will hereinafter be described. Connecting portion 58 is provided with recesses 60 on opposite sides thereof, which register with the recesses 30 when the upper housing 12 is installed on the lower housing 14, to define grooves 62.

Upper housing 12 further includes ears 64 at the corners thereof. Each of the ears 64 defines an aperture 66 which registers with the apertures 18 on the lower base housing 14 when the socket 12 is assembled. When the socket is assembled, apertures 66 on the upper base housing 12 register with the apertures 18 on the lower base housing 14. Threaded inserts 68 are installed through the aperture 66, 68 to secure the upper base housing 12 to lower base housing 14. Each of the ears 64 include upwardly projecting members 72 which face one another and are disposed outwardly of the end edges 52, 54. Ears 64 further include upwardly extending members 74, each of which faces a corresponding member 74 and both of which extend outwardly from the side edges 46, 48. Each of the members 72, 74 include a locating surface 76 which, when the socket is assembled and is ready for use, engage outer frame 78 of an integrated circuit indicated by the numeral 80 to locate the chip in its proper position within cavity 82 defined by the socket. Integrated circuit 80 includes multiple terminals extending between the body of the chip 84 and the frame 78. Conventionally, a large number of terminals are required for the integrated circuit chip 80. These terminals are commonly closely spaced together, and extend from all edges of the chip. It is necessary that the socket 10 be able to make an electrical connection between each of the terminals 86 independently with corresponding conductors within the circuit board 70.

The portion of each of the ears 66 below the upwardly extending members 72 are provided with a substantially square open ended cavity 88, which is closed by the pads 42 when the upper and lower base housings are secured together. The portion of each of the ears 64 beneath upwardly extending portions 74 along the side edges 46, 48 of the upper base member 12 are provided with arcuate notches 90, which are closed by the ears 76 when the socket 10 is assembled.

Multiple bent wire contacts 92, which will be described in detail hereinafter are mounted in longer contact holders 98 and shorter contact holders 94. Each of the end contact holders 94 are provided with substantially square projections 96 on opposite ends thereof, which are received within the cavities 88 to thereby position and retain the end contact holders 94 in their proper positions. The longer contact holders 98 include a longitudinally extending rib 100 which is received within the gap 62 (FIG. 9) when the socket is assembled, to thereby position and retain the contact holders 98.

Referring now to FIGS. 4, 5, and 6, each of the contacts 92 are torsion wire contacts and are manufacturing from a wire segment by winding a wound portion 102 at substantially the center of the wound segment. The wound portion 102 is substantially one and one half turns. A pair of arms 104, 106 extend from opposite ends of the wound portion 102. Each of the arms 104, 106 terminates in a diverging end portion 108, 110, each of which terminates in a transversely extending end face 112, 114. Each of the contact holders 94, 98 includes an internal volume 116, 118 which is divided into multiple, substantially parallel, cavities 120 by walls 122, 124 on the lower and upper sides of the cavity respectively. Each of the contact holders 94, 98 include upper and lower outer edge portion 124, 126 which define the entrance to the cavities 120. Each of the end portions 124, 126 are provided with multiple, parallel slots 128, 130. Each of the slots 128, 130 register with a corresponding cavity 120 and with the slot 128 or 130 on the other edge portion 124 or 126. Accordingly, the cavities 120 are sized to accept the wound portion 102 of the contacts 104. When the contacts 92 are installed in the contact holders, the legs 104, 106 extend between the round portion 102 and the slots 128, 130. End portions 108 extend through a corresponding one of the slots 128, and the end portion 110 extends through one of the corresponding slots 130. FIG. 4 illustrates the free shape of the spring 92, that is, before it is installed in a contact holder 94 or 98. FIG. 5 illustrates the shape assumed by the contact 92 after it is installed in a contact holder, but before the contact holder has been installed in the socket. It will be noted that the cavities 120 bias the legs 104, 106 such that they extend substantially parallel to one another. FIG. 6 illustrates the shape of the torsion spring contacts 92 after the contact holders have been installed in the socket and a circuit chip has been installed in the socket. As will hereinafter be described, the arms 104, 106 are deflected into the positions illustrated. Referring now to FIG. 9, when the contact holders 98 are installed in the socket 10, ribs 100 are received within the gaps 62 defined by the connecting portions 58, 28. The slots 128 are brought into registry with the apertures 50, the edge portion 124 extending beneath the side edges 46, 48. Similarly, the slots 130 of the contact holders 98 are in registry with the apertures of 38 on the lower base housing 16, it being noted that the edge portion 126 rests upon projecting portion 36 of the lower base housing 16. Accordingly, end portion 108 of the terminals 92 installed within contact holders 98 extend through a corresponding slot 128 and corresponding aperture 50 to permit the transverse face 112 to engage a corresponding one of the terminals 86 of the chip 80. Similarly, end portion 110 extends through corresponding slot 130 and through a corresponding one of the apertures 38 to permit the transverse face 114 to make electrical contact with one of the conductors of the printed circuit board 70. Contacts 92 are similarly installed in contact holder 94, with end portions 110 extending through apertures 34 and end portions.

A pair of latching levers 132, 134 are pivotally mounted between each of the upwardly extending members 74 and extend parallel to the side edges of the base housings 12, 14. Levers 132, 134 are mounted on pivot pins 136 which extend through apertures 138 on the levers 132, 134. The opposite ends of pivot pins 136 are received within arcuate openings 90. Springs 140 are mounted on the pivot pins 136 and bias the latching levers 132, 134 toward the cavity 82. Each of the latching levers 132, 134 includes a lip 142 that engages the frame 78 of the chip 80 when the chip 80 is installed in the cavity 82. Each of the latching levers 132, 134 include projecting handles 144 to enable the levers 132, 134 to be pivoted away from the cavity 82 when the chip 80 is to be removed therefrom. However, it will be noted that the handles 144 on the latching lever 132 are offset from the handles on the latching lever 134. Referring to the FIGS. 11 and 12, it is customary to pack sockets 10 as closely as possible on printed circuit board. As indicated in FIG. 12, the offset of the handles 144 enables both of the handles to simultaneously be pivoted from the latched position illustrated in FIG. 11 to the released position illustrated in FIG. 12 without interference with one another.

Downwardly projecting member 146 projects downwardly from connecting portion 28 and provides rough alignment of the socket 10 on the circuit board 70 by engaging an aperture in the circuit board. Pins 43 are then recessed in corresponding apertures in the circuit board to provide the final alignment of the socket on the circuit board.

When a chip 80 is to be tested, the chip is positioned over the cavity 82 and then forced downwardly, thereby deflecting the latching levers 134, 136 outwardly from the solid to the dashed position in FIG. 9. Accordingly, the integrated circuit 80 is installed in the cavity 82, the arms 104 of the contacts 92 deflecting as illustrated in FIG. 9 as the chip 80 is forced downwardly to first engage the terminals 86 with the transverse ends 112 of the contacts 92. It will be noted that the wound portion 102 of each contact accommodates this deflection, and, since the wound portion allows the contact to be deflected multiple times without damage to the wound portion, the contacts 92 have a substantially increased life over prior art stamped contacts. Accordingly, a socket incorporating the torsion spring contacts 92 has a much longer life than prior art sockets. Still further, each of the contacts 92 are wound from a simple coupling of wire, and require no special dies or manufacturing equipment. Accordingly, the wound torsion spring contacts 92 are substantially less expensive than prior art contacts. Since the contacts are made form a single wire, they may be packed very tightly together as compared to prior art contacts, so that closely spaced terminals on the chip 80 are easily accommodated. When the chip 80 is to be released from the socket, the latching levers 134, 136 are deflected outwardly, thereby permitting extraction of the integrated circuit 80 from the cavity 82.

What is claimed is:

1. A socket for positioning and installing an integrated circuit having terminals on a circuit board comprising a base, a contact holder mounted in said base, and a torsion wire contact mounted in said contact holder, said torsion wire contact including a wire segment having a wound portion wound through at least 360 degrees and a pair of arms extending from opposite ends of the wound portion, one of said arms engaging a terminal of the integrated circuit when the integrated circuit is installed in the socket whereby deflection of either of said arms torques said wound portion, said wound portion accommodating said deflection of said arms without damaging said contact.

2. A socket as claimed in claim 1, further including a plurality of torsion wire contacts and wherein said contact holder defines multiple parallel cavities defined between parallel walls terminating in an outer edge, each of said cavities receiving the wound portion of one of said contacts, each of said arms extending along a corresponding one of said walls and terminating in diverging end portions extending over said outer edges.

3. A socket as claimed in claim 2, wherein each of said outer edges includes multiple parallel slots, each of said diverging end portions extending through a corresponding one of said slots.

4. A socket as claimed in claim 2, wherein each of said outer edges include an upper section and a lower section with a gap therebetween, each section of said outer edge defining multiple parallel slots, the slots on one section registering with corresponding slots on the other section, the diverging end portions of each contact extending through a corresponding slot on the upper and lower sections.

5. A socket as claimed in claim 4, wherein said base includes an upper housing having a first set of apertures and a lower housing having a second set of apertures, one of said end portions of each contact extending through the first set of apertures, the other end portion of each contact extending through the second set of apertures.

6. A socket as claimed in claim 5, wherein said upper housing defines a cavity for receiving said integrated circuit, said one end portion of each contact extending through a corresponding one of the first set of apertures to engage a corresponding terminal of the integrated circuit when the integrated circuit is installed in the cavity.

7. A socket as claimed in claim 6, wherein said other end portion of each contact extends through a corresponding one of the second set of apertures for engagement with the printed circuit board.

8. A socket as claimed in claim 6, wherein a first pair of said contact holders are mounted on opposite sides of said base substantially parallel to one another and a second pair of said contact holders are mounted on opposite ends of said base substantially parallel to one another.

9. A socket as claimed in claim 6, wherein a pair of side contact holders are mounted on opposite sides of said base substantially parallel to one another, and further including a pair of latching levers pivotally mounted on said base and movable from a released position displaced from said cavity to permit insertion and removal of the integrated circuit in the cavity to an engaged position engaging the integrated circuit within the cavity and urging the terminals of the integrated circuit against the one end portion of each of the contacts, the wound portion of the contacts within the contact holders yielding in response to force applied to the integrated circuit by said latching levers to accommodate movement of the integrated circuit toward the contact holders.

10. A socket as claimed in claim 9, wherein said side contact holders are clamped between the upper and lower housings.

11. A socket as claimed in claim 10, wherein a pair of end contact holders are mounted in said base and extend transversely with respect to the side contact holders, each of said end contact holders supporting contacts engaged with terminals on said integrated circuit.

12. A socket as claimed in claim 1, wherein said base defines a cavity for receiving said integrated circuit, said contacts extending into said cavity, a latching lever mounted on said base and movable from a released position displaced from said cavity to permit insertion and removal of the integrated circuit in the cavity to an engaged position engaging the integrated circuit within the cavity and urging the terminals of the integrated circuit against the contacts, the wound portion of the contacts yielding in response to force applied to the integrated circuit by said latching lever to accommodate movement of the integrated circuit toward the contact holders.

13. A socket as claimed in claim 1, wherein a first pair of said contact holders with said contacts installed therein is mounted on opposite sides of said base and a second pair of said contact holders are mounted on opposite ends of the base.

14. A socket as claimed in claim 1, wherein said base defines a cavity for receiving said integrated circuit, one arm of each contact extending from said contact holder and into said cavity and terminating in a transversely extending end face engaging a terminal of said integrated circuit, the wound portions of said contacts extending vertically within said contact holder and yielding to accommodate a downward force exerted on said end face and transmitted to said wound portion through said one arm.

15. A socket as claimed in claim 14, wherein a latching lever is mounted on said base and is movable from a released position displaced from said cavity to permit insertion and removal of the integrated circuit in the cavity to an engaged position engaging the integrated circuit within the cavity and urging the terminals of the integrated circuit against the transversely extending end face of the contacts.

16. A socket for positioning and installing an integrated circuit having terminals on a circuit board comprising a base, said base defining a cavity for receiving said integrated circuit, a contact holder mounted in said base, and a torsion wire contact mounted in said contact holder, said contact including a first arm having an axis, said first arm projecting into said cavity and terminating in an end face extending transverse to said axis, said end face engaging one of the terminals of the integrated circuit, and a latching lever mounted on said base and movable from a released position displaced from said cavity to permit insertion and removal of the integrated circuit in the cavity to an engaged position engaging the integrated circuit within the cavity and urging a corresponding terminal of the integrated circuit against the transversely extending end face of the contact, said contact including means for accommodating rotational movement of said first arm in response to deflection thereof by said integrated circuit.

17. A socket as claimed in claim 16, wherein said means for accommodating is a wound portion of said contact.

18. A socket as claimed in claim 16, wherein said socket includes a second arm having an axis substantially parallel to the axis of the first arm, said second arm extending to said circuit board for providing an electrical path between said corresponding terminal and said circuit board, said first arm being connected to said second arm by a wound portion of said contact mounted within said contact holder defining said means for accommodating axial movement of said first arm.

19. A socket as claimed in claim 18, wherein said base includes an upper housing and a lower housing, said contact holder being clamped between the upper housing and the lower housing, said first arm extending through an aperture in the upper housing, said second arm extending through an aperture in said lower housing.

20. A socket for connecting an integrated circuit having terminals to a circuit board, the socket comprising:
 a base;
 a plurality of torsion wire contacts located in the base, each of the contacts including a wound portion wound through at least 360 degrees and a pair of arms extending from the wound portion, one of the arms extending in a first direction and engaging a terminal of the integrated circuit when the integrated circuit is installed in the socket and the other arm extending toward the circuit board.

21. A socket as claimed in claim 20, further including a contact holder located in the base, the contact holder having a plurality of cavities for receiving the wound portions of the contacts.

22. A socket as claimed in claim 21, wherein the contact holder has an upper edge portion having a plurality of slots, a lower edge portion having a plurality of slots, and wherein one arm of each contact extends through one of the slots in the upper edge and the opposite arm of each contact extends through one of the slots in the lower edge.

23. A socket as claimed in claim 22, wherein the slots in the upper edge are aligned with the slots in the lower edge.

24. A socket as claimed in claim 20, wherein the base includes an upper housing having a first set of apertures and a lower housing having a second set of apertures, and wherein one arm of each contact extends through one of the first set of apertures.

25. A socket as claimed in claim 20, further including a contact holder located on each side of the base.

26. A socket as claimed in claim 25, wherein each of the contact holders includes cavities for receiving the wound portions of the contacts.

27. A socket as claimed in claim 20, further including pair of latching levers mounted on the base and movable from a first position permitting insertion and removal of the integrated circuit and a second position securing the integrated circuit within the socket.

28. A socket as claimed in claim 25, wherein the base includes an upper portion and a lower portion and the contact holders are located between the upper and lower housings.

* * * * *